(12) United States Patent
Lin et al.

(10) Patent No.: US 10,283,684 B2
(45) Date of Patent: May 7, 2019

(54) LIGHT EMITTING DEVICE AND MANUFACTURING METHOD THEREOF

(71) Applicant: PlayNitride Inc., Tainan (TW)

(72) Inventors: Tzu-Yang Lin, Tainan (TW); Yu-Hung Lai, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/822,207

(22) Filed: Nov. 27, 2017

(65) Prior Publication Data

US 2018/0076365 A1 Mar. 15, 2018

Related U.S. Application Data

(63) Continuation of application No. 15/001,254, filed on Jan. 20, 2016, now Pat. No. 9,859,478.

(30) Foreign Application Priority Data

Sep. 4, 2015 (TW) .............................. 104129267 A

(51) Int. Cl.
| | |
|---|---|
| *H01L 29/18* | (2006.01) |
| *H01L 33/00* | (2010.01) |
| *H01L 33/54* | (2010.01) |
| *H01L 27/15* | (2006.01) |
| *H01L 25/075* | (2006.01) |
| *H01L 33/44* | (2010.01) |
| *H01L 33/62* | (2010.01) |

(52) U.S. Cl.
CPC .......... *H01L 33/54* (2013.01); *H01L 25/0753* (2013.01); *H01L 27/156* (2013.01); *H01L 33/0079* (2013.01); *H01L 33/44* (2013.01); *H01L 33/62* (2013.01); *H01L 2224/16225* (2013.01); *H01L 2933/0033* (2013.01)

(58) Field of Classification Search
CPC ....... H01L 2924/00; H01L 2924/12041; H01L 2924/0002; H01L 21/6835; H01L 2221/68318; H01L 2221/68363
See application file for complete search history.

(56) References Cited

U.S. PATENT DOCUMENTS

| | | | | |
|---|---|---|---|---|
| 2010/0084759 A1* | 4/2010 | Shen | ..................... | H01L 21/568 257/690 |
| 2011/0183467 A1* | 7/2011 | Chen | ..................... | H01L 21/561 438/108 |
| 2011/0275172 A1* | 11/2011 | Okabe | ................. | H01L 33/0095 438/33 |

(Continued)

*Primary Examiner* — Ismail A Muse
(74) *Attorney, Agent, or Firm* — JCIPRNET

(57) ABSTRACT

A light emitting device includes a first substrate, a second substrate and a plurality of micro epitaxial structures. The second substrate is disposed opposite to the first substrate. The micro epitaxial structures are periodically disposed on the substrate and located between the first substrate and the second substrate. A coefficient of thermal expansion of the first substrate is CTE1, a coefficient of thermal expansion of the second substrate is CTE2, a side length of each of the micro epitaxial structures is W, W is in the range between 1 micrometer and 100 micrometers, and a pitch of any two adjacent micro epitaxial structures is P, wherein W/P=0.1 to 0.95, and CTE2/CTE1=0.8 to 1.2.

4 Claims, 18 Drawing Sheets

(56) References Cited

U.S. PATENT DOCUMENTS

| | | | |
|---|---|---|---|
| 2012/0193653 A1* | 8/2012 | Horng | H01L 25/0753 257/88 |
| 2012/0231260 A1* | 9/2012 | Kim | C09J 133/08 428/327 |
| 2013/0285077 A1* | 10/2013 | Kojima | H01L 25/0753 257/88 |
| 2014/0312368 A1* | 10/2014 | Lee | H01L 21/6835 257/89 |
| 2016/0013376 A1* | 1/2016 | Maki | H01L 25/0753 257/88 |
| 2016/0087165 A1* | 3/2016 | Lee | H01L 21/6835 438/27 |
| 2016/0322290 A1* | 11/2016 | Ma | H01L 23/49822 |
| 2017/0018691 A1* | 1/2017 | Lee | H01L 21/6835 |
| 2017/0222102 A1* | 8/2017 | Cheng | H01L 33/483 |
| 2017/0358624 A1* | 12/2017 | Takeya | H01L 27/156 |

\* cited by examiner

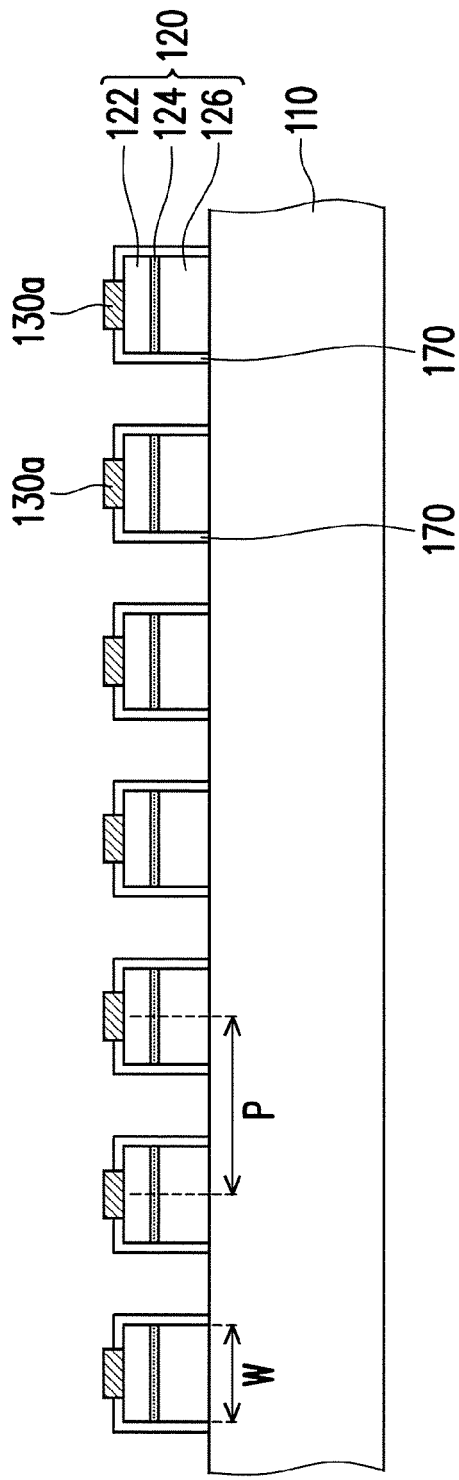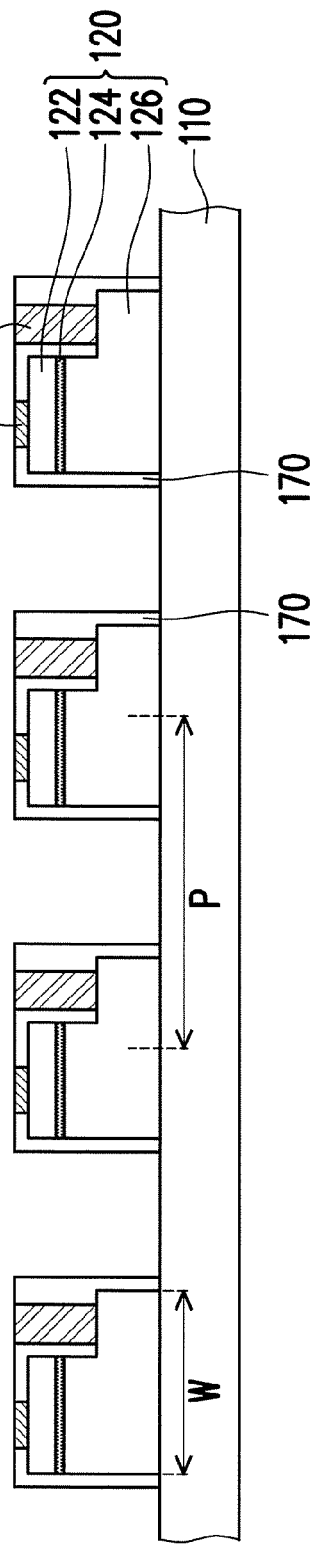
FIG. 3A(a)
FIG. 3A(b)

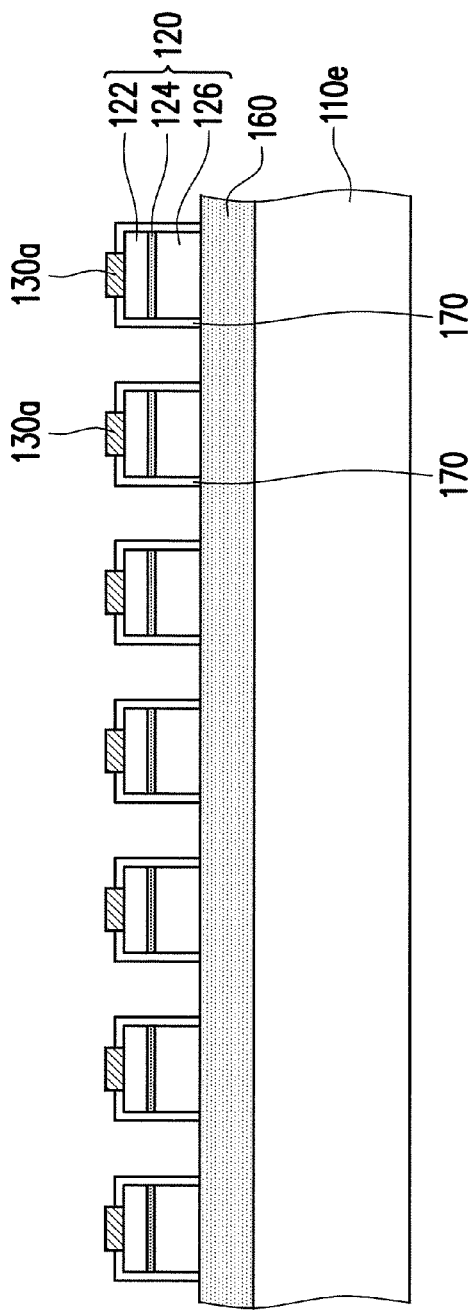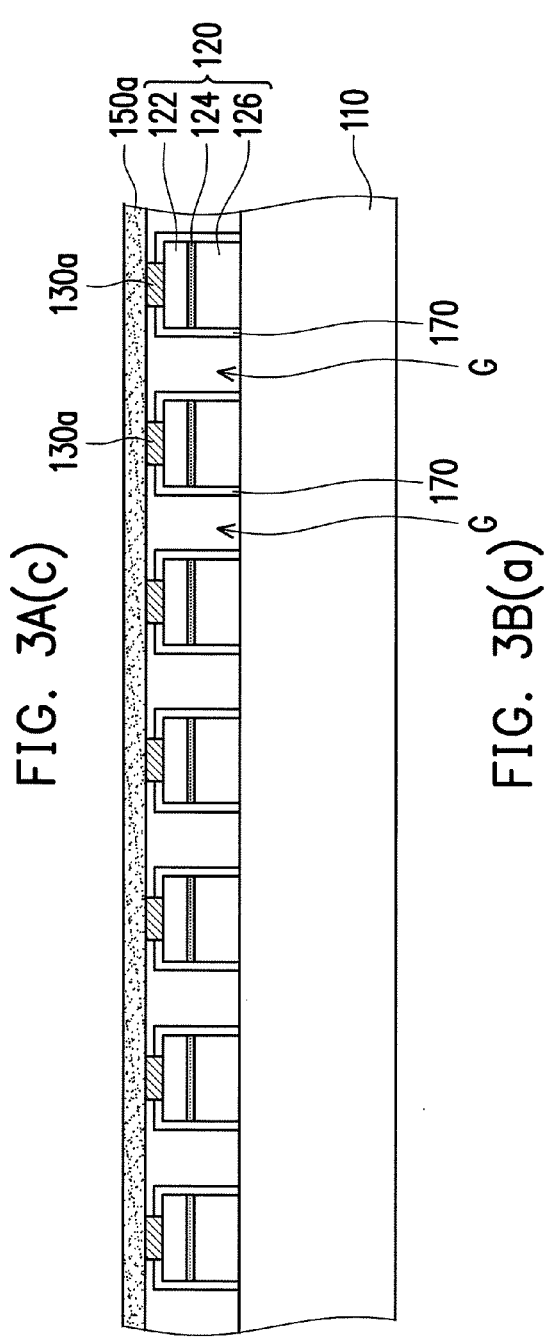

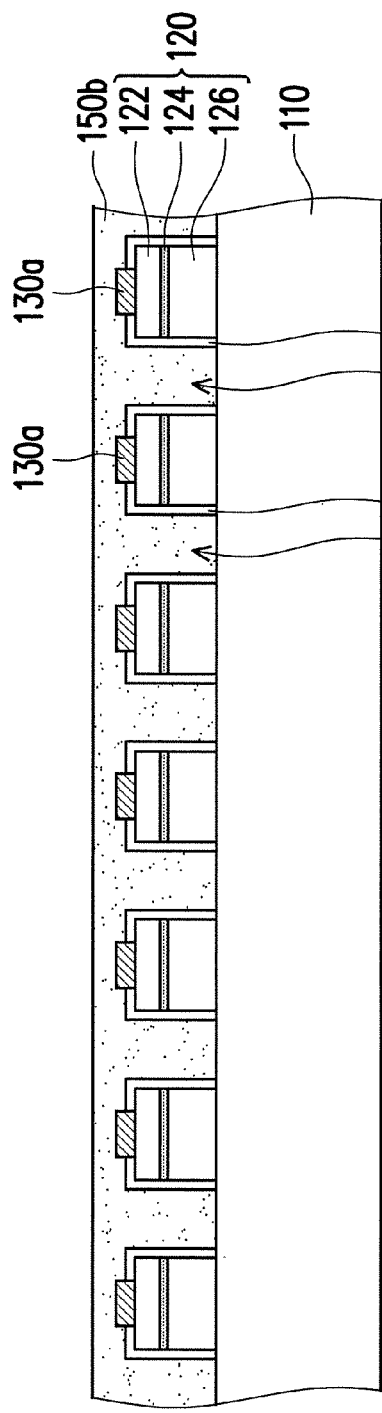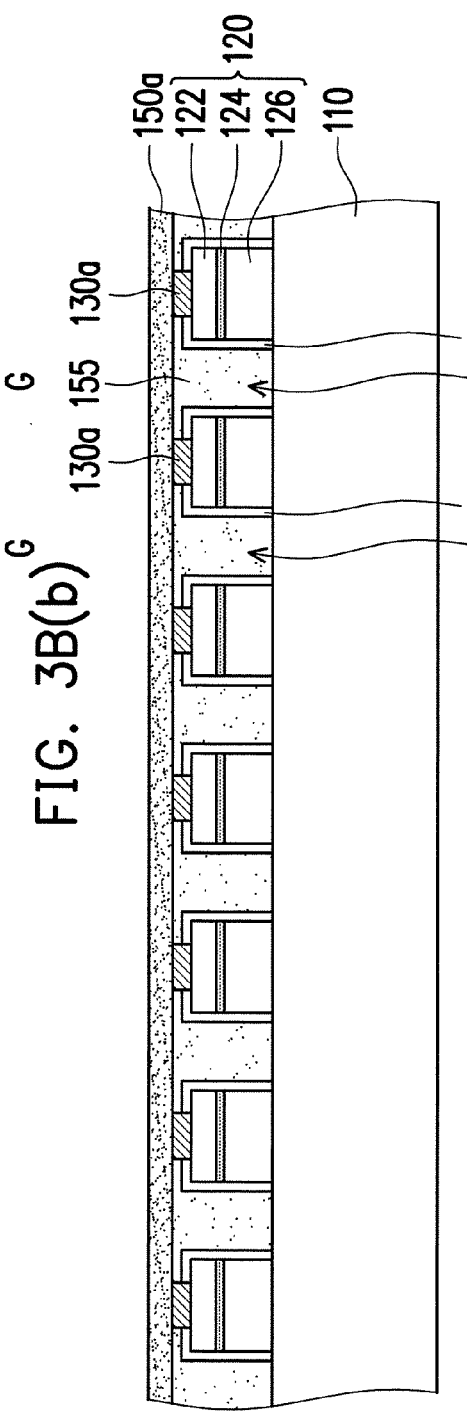
FIG. 3B(b)
FIG. 3B(c)

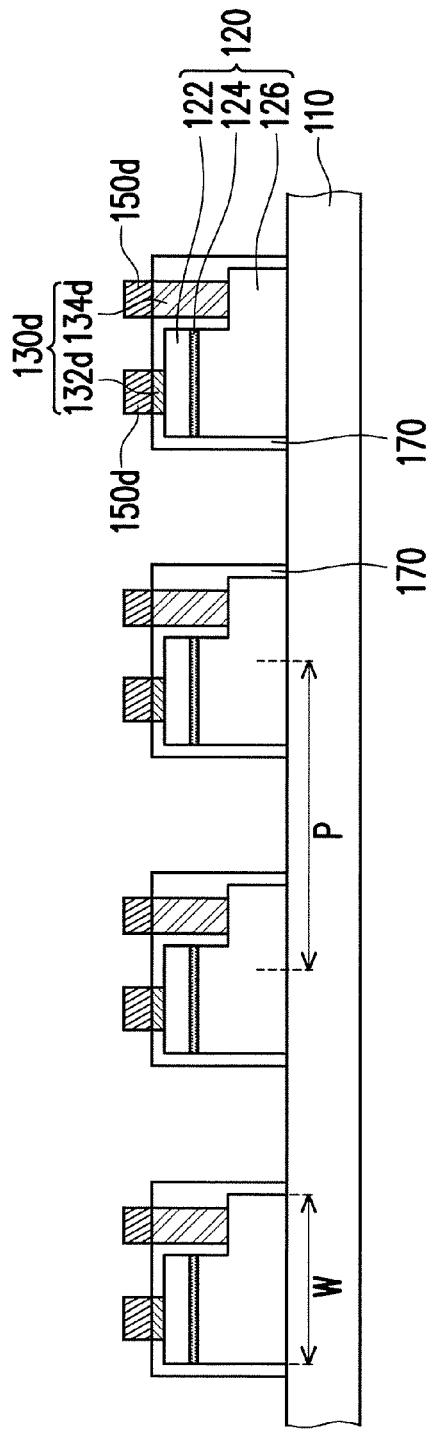
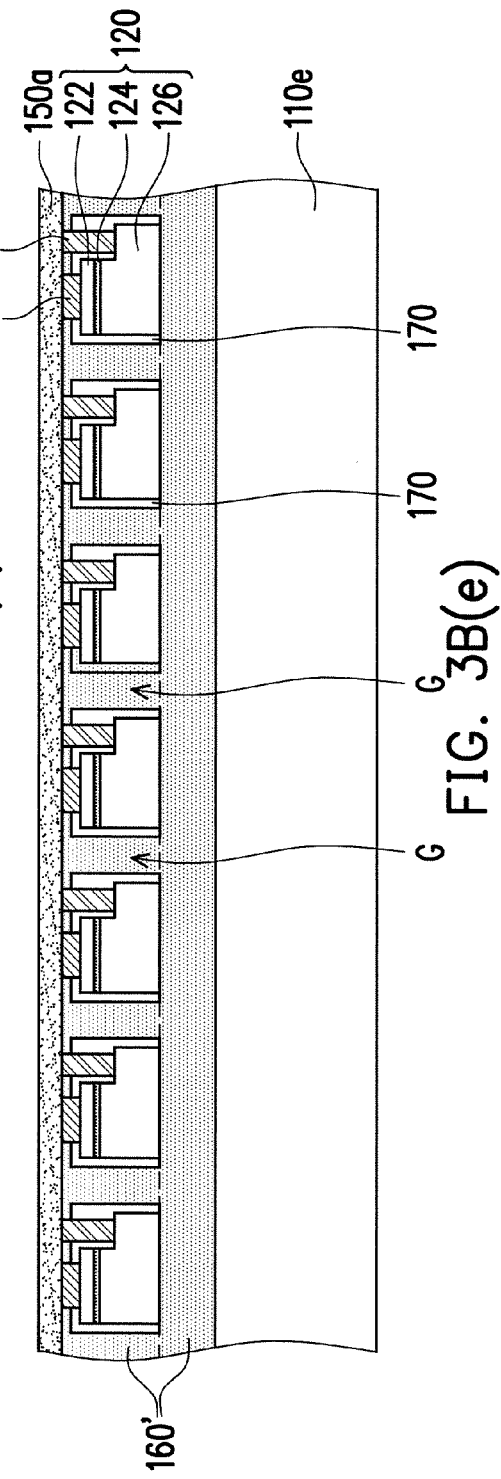
FIG. 3B(d)
FIG. 3B(e)

LIGHT EMITTING DEVICE AND MANUFACTURING METHOD THEREOF

CROSS-REFERENCE TO RELATED APPLICATION

This application is a continuation application of and claims the priority benefit of U.S. application Ser. No. 15/001,254, filed on Jan. 20, 2016, now allowed, which claims the priority benefit of Taiwan application serial no. 104129267, filed on Sep. 4, 2015. The entirety of each of the above-mentioned patent applications is hereby incorporated by reference herein and made a part of this specification.

BACKGROUND OF THE INVENTION

1. Field of the Invention

The invention generally relates to a semiconductor element and a manufacturing method thereof, and more particularly, to a light emitting device and a manufacturing method thereof.

2. Description of Related Art

In current manufacturing process of a light emitting diode (LED) structure, first of all, an epitaxial structure is formed on a growth substrate. The epitaxial structure includes a first-type semiconductor layer, a light emitting layer and a second-type semiconductor layer sequentially formed on the growth substrate. Subsequently, a permanent substrate or a temporary substrate is bonded on the second-type semiconductor layer to form the LED structure or a LED structure to be transferred. In general, the growth substrate mainly uses a sapphire substrate, which has a coefficient of thermal expansion very different from a coefficient of thermal expansion of the permanent substrate or the temporary substrate. Therefore, when the epitaxial structure is transferred from the growth substrate onto the permanent substrate or the temporary substrate, a shift phenomenon may occur under an influence of the thermal stress to affect an alignment precision of the product or the device.

SUMMARY OF THE INVENTION

The invention is directed to a light emitting device with a preferable alignment precision.

The invention is further directed to a manufacturing method of a light emitting device for manufacturing the said light emitting device.

The light emitting device of the invention includes a first substrate, a second substrate, a plurality of micro epitaxial structures, a first adhesive layer and a second adhesive layer. The second substrate is disposed opposite to the first substrate. The micro epitaxial structures are disposed on the first substrate and bonded with the second substrate via a thermocompression bonding method. A coefficient of thermal expansion of the first substrate is CTE1, a coefficient of thermal expansion of the second substrate is CTE2, a side length of each of the micro epitaxial structures is W, W ranges from 1 to 100 micrometers, and a pitch of any two adjacent micro epitaxial structures is P, wherein W/P=0.1 to 0.95, and CTE2/CTE1=0.8 to 1.2. The first adhesive layer is disposed between the micro epitaxial structures and the second substrate. The second substrate is connected to the first substrate through the first adhesive layer. The second adhesive layer is disposed between the micro epitaxial structures and the first substrate. The micro epitaxial structures are connected to the first substrate through the second adhesive layer. Each of the micro epitaxial structures directly contacts the first adhesive layer, and the second adhesive layer contacts a plurality of side-walls of the micro epitaxial structures.

The manufacturing method of the light emitting device of the invention includes the following steps. A first substrate is provided. A coefficient of thermal expansion of the first substrate is CTE1, and the first substrate has a plurality of micro epitaxial structures disposed thereon. The micro epitaxial structures are connected to the first substrate through an adhesive layer. A side length of each of the micro epitaxial structures is W, W ranges from 1 to 100 micrometers, and a pitch of any two adjacent micro epitaxial structures is P, wherein W/P=0.1 to 0.95. A bonding material is provided on the first substrate. A second substrate is disposed opposite to the first substrate, the micro epitaxial structures are located between the first substrate and the second substrate, and the second substrate is bonded with the micro epitaxial structures through the bonding material, wherein the bonding material is covered on the micro epitaxial structures via a film coating method and then bonded with the second substrate via a thermocompression bonding method, and the second substrate is connected to the first substrate through the bonding material, wherein a coefficient of thermal expansion of the second substrate is CTE2, and CTE2/CTE1=0.8 to 1.2. The first substrate and the micro epitaxial structures are separated.

In one embodiment of the invention, each of the micro epitaxial structures includes a first type semiconductor layer, a second type semiconductor layer and an active layer located between the first type semiconductor layer and the second type semiconductor layer, and the second adhesive layer directly contacts the second type semiconductor layer.

In one embodiment of the invention, each of the micro epitaxial structures defines a vertical light-emitting diode chip.

In view of the above, since the coefficient of thermal expansion (i.e., CTE1) of the first substrate and the coefficient of thermal expansion (i.e., CTE2) of the second substrate of the light emitting device of the invention are related to the side length (i.e., W) and the pitch (i.e., P) of the micro epitaxial structures, when W ranges from 1 to 100 micrometers and W/P=0.1 to 0.95, CTE2/CTE1=0.8 to 1.2. That is, the light emitting device of the invention adopts the first substrate and the second substrate which have similar coefficients of thermal expansion. Therefore, in the substrate transfer process, when the micro epitaxial structures are about to be transferred from the first substrate onto the second substrate, the micro epitaxial structures will not produce a displacement due to a variation between the coefficients of thermal expansion of the first substrate and the second substrate. As a result, the micro epitaxial structures can be transferred between the first substrate and the second substrate with a fixed pitch, and thereby can have a preferable alignment precision.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A' is cross-sectional diagram illustrating a light emitting device according to another embodiment of the invention.

DESCRIPTION OF THE EMBODIMENTS

Figure 1A:
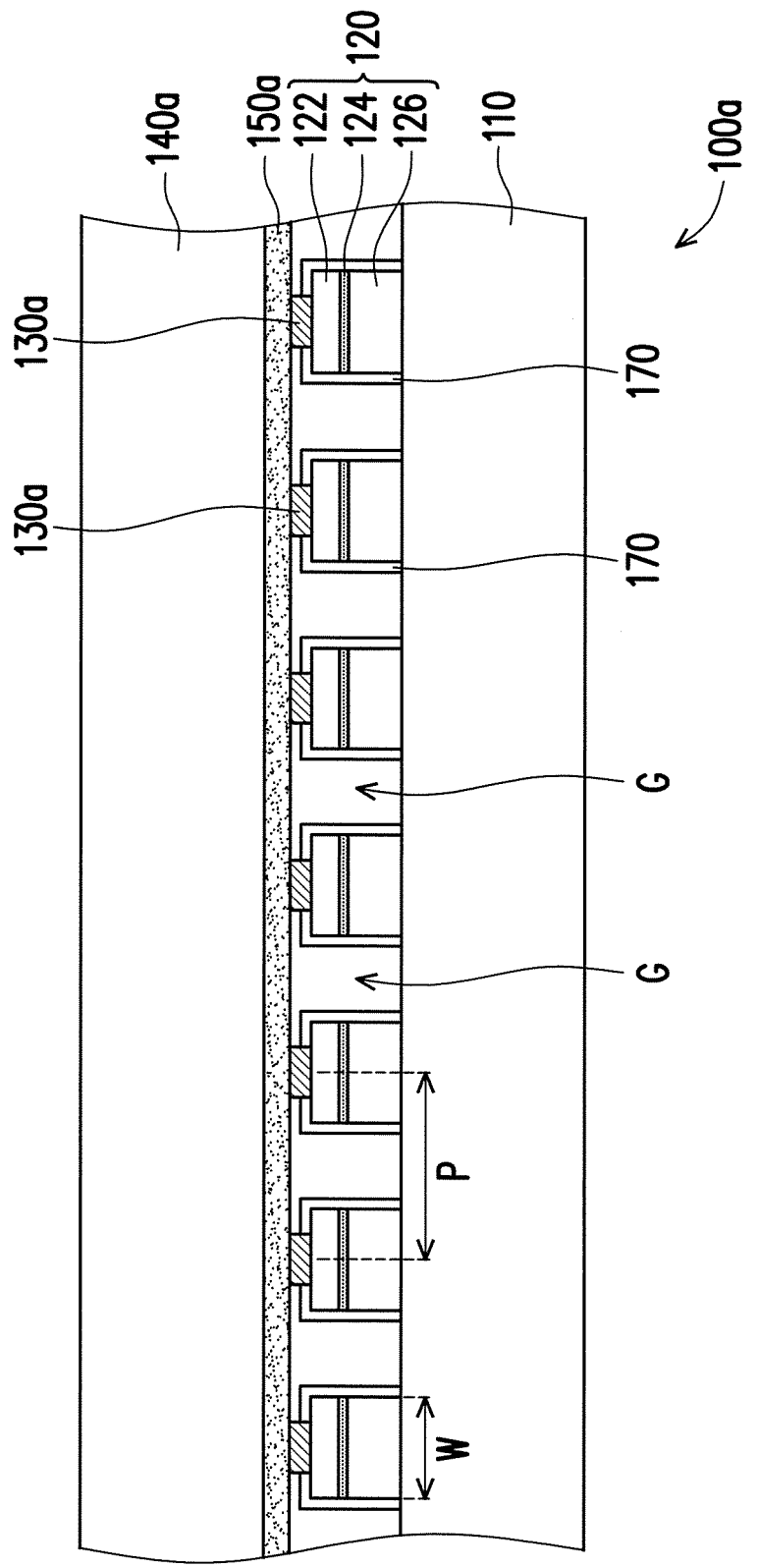
FIG. 1A is cross-sectional diagram illustrating a light emitting device according to an embodiment of the invention.
Figure 1A:
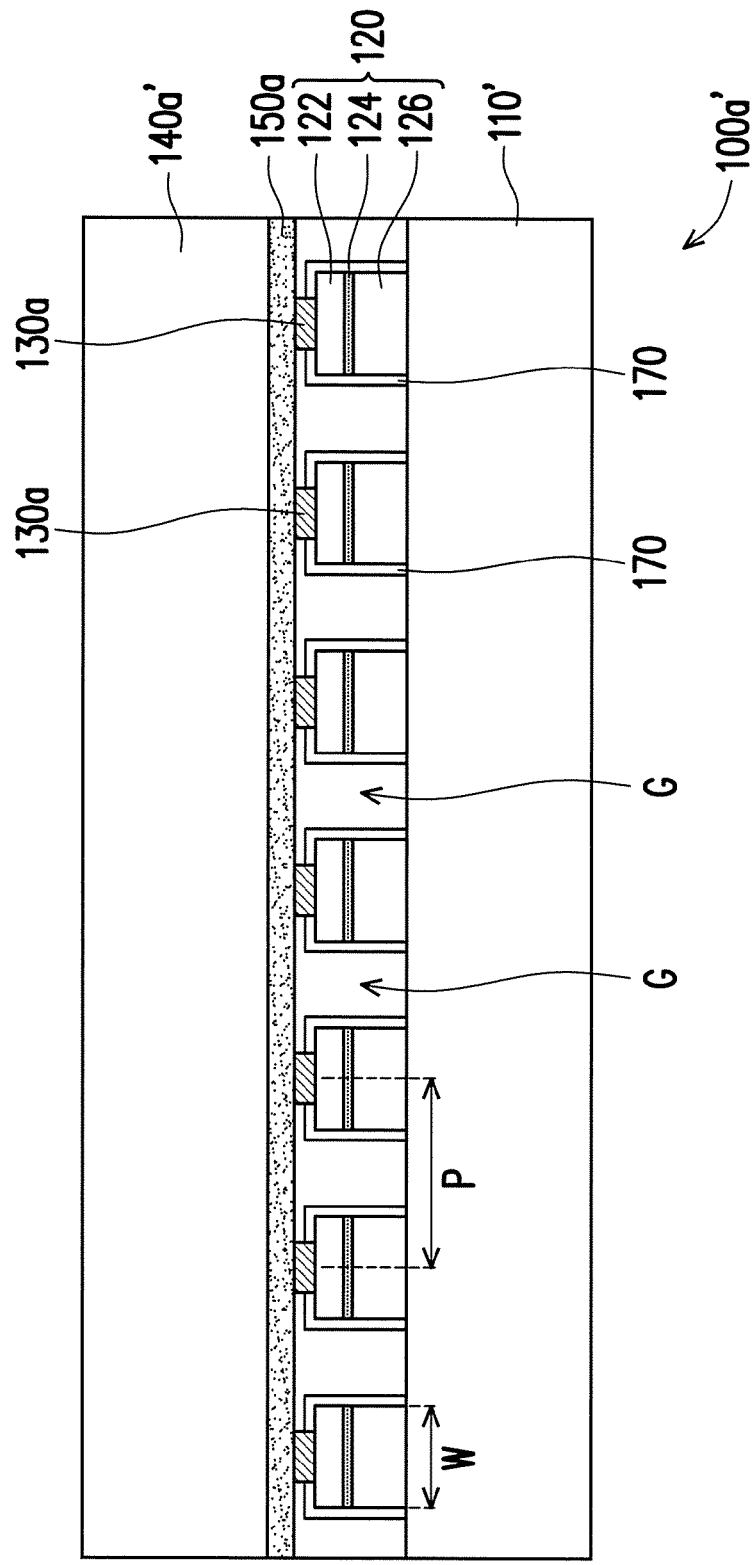

FIG. 1A is cross-sectional diagram illustrating a light emitting device according to an embodiment of the invention. Referring to FIG. 1A, in the present embodiment, a light emitting device 100a includes a first substrate 110, a second substrate 140a and a plurality of micro epitaxial structures 120. The second substrate 140a is disposed opposite to the first substrate 110. The micro epitaxial structures 120 are periodically disposed on the first substrate 110 and located between the first substrate 110 and the second substrate 140a. A coefficient of thermal expansion of the first substrate 110 is CTE1, a coefficient of thermal expansion of the second substrate 140a is CTE2, a side length of each of the micro epitaxial structures 120 is W, W ranges from 1 to 100 micrometers, and a pitch of any two adjacent micro epitaxial structures 120 is P, wherein W/P=0.1 to 0.95, and CTE2/CTE1=0.8 to 1.2. Herein, sizes and shapes of the first substrate 110 and the second substrate 140a are not particularly limited. It is to be noted that, the pitch P is defined by a distance between the centrelines of any two adjacent micro epitaxial structures 120.

In detail, the first substrate 110 of the present embodiment is, for example, a sapphire substrate, wherein the micro epitaxial structures 120 directly contact the first substrate 110, and the first substrate 110 is a growth substrate of the micro epitaxial structures 120. The micro epitaxial structures 120 are periodically disposed on the first substrate 110, wherein each of the micro epitaxial structures 120 includes a first type semiconductor layer 122, an active layer 124 and a second type semiconductor layer 126. The active layer 124 is located between the first type semiconductor layer 122 and the second type semiconductor layer 126. In each of the micro epitaxial structures 120 of the present embodiment, the first type semiconductor layer 122 is, for example, a P-type semiconductor layer, the second type semiconductor layer 126 is, for example, a N-type semiconductor layer, and the active layer 124 is a multiple quantum well (MQW) structure. In other not embodiment (not shown), it may also be that the first type semiconductor layer 122 is, for example, e a N-type semiconductor layer, the second type semiconductor layer 126 is, for example, is a P-type semiconductor layer, and the active layer 124 is a MQW structure, but the invention is not limited thereto. Particularly, a current density at the highest peak value of an external quantum efficiency curve of each of micro epitaxial structures 120 of the present embodiment is, preferably, below 2 $A/cm^2$, and more preferably, ranges from 0.5 $A/cm^2$ to 1.5 $A/cm^2$. Namely, the light emitting device 100a of the present embodiment is adapted to be operated under a condition of low current density. On the other hand, each of the micro epitaxial structures 120 of the present embodiment may serve as a sub-pixel in a display. More specifically, the micro epitaxial structures 120 of the present embodiment have different sizes than epitaxial structures of the conventional light emitting diodes that are commonly used. In detail, a side length of each of the epitaxial structures of the conventional light emitting diodes epitaxial structures ranges from 0.2 mm to 1 mm, while the side length of each of the micro epitaxial structures 120 of the present embodiment ranges from 1 micrometer to 100 micrometers; and preferably, the side length of each of the micro epitaxial structures 120 ranges from 3 micrometers to 40 micrometers. In addition, a defect density of each of the micro epitaxial structures 120 of the present embodiment is also less; preferably, the defect density of each of the micro epitaxial structures 120 is less than $10^8/cm^2$; and more preferably, the defect density of each of the epitaxial structures 120 ranges from $5 \times 10^5/cm^2$ to $10^8/cm^2$.

Moreover, the light emitting device 100a of the present embodiment further includes a plurality of bonding pads 130a, wherein the bonding pads 130a are respectively disposed on the micro epitaxial structures 120 and located on surfaces of the micro epitaxial structures 120 which are relatively distant to the first substrate 110. That is to say, the surface of each of the micro epitaxial structures 120 that is relatively distant to the first substrate 110 is disposed with one bonding pad 130a. In order to protect the micro epitaxial structures 120, the light emitting device 100a of the present embodiment may further include a plurality of insulating layers 170, wherein the insulating layers 170 respectively encapsulate sides of the micro epitaxial structures 120, and the insulating layers 170 expose the bonding pads 130a, so as to effectively protect the edges of the micro epitaxial structures 120 and prevent water vapor and oxygen invasions, and thereby effectively enhance the product reliability of the overall light emitting device 100a. Herein, a material of the insulating layers 170 is, for example, silicon dioxide, alumina, silicon nitride or a combination thereof. Moreover, in another embodiment, referring to FIG. 1A', the first substrate 110' and the second substrate 140a' of the light emitting device 100a' may have approximately the same size and shape, so that the first substrate 110' and the second substrate 140a' can have similar boundary conditions, thereby effectively enhancing a transfer yield of the micro epitaxial structures 120 at the edges.

Sine the coefficient of thermal expansion (i.e., CTE1) of the first substrate 110 and the coefficient of thermal expansion (i.e., CTE2) of the second substrate 140a of the light emitting device 100a of the present embodiment are related to the side length (i.e., W) and the pitch (i.e., P) of the micro epitaxial structures 120, when W/P=0.1 to 0.95, CTE2/CTE1=0.8 to 1.2. Preferably, when W/P ranges from 0.1 to 0.6, CTE2/CTE1=0.9 to 1.1. That is, the light emitting device 100a of the present embodiment uses the first substrate 110 and the second substrate 140a which have similar coefficients of thermal expansion, and thus in a substrate transfer process, such as when transferring the micro epitaxial structures 120 from the first substrate 110 onto the second substrate 140a, the micro epitaxial structures 120 will not produce a displacement due to differences between the coefficients of thermal expansion of the first substrate 110 and the second substrate 140a. As a result, the micro epitaxial structures 120 can be transferred between the first substrate 110 and the second substrate 140a with a fixed pitch, and thus can have a preferable alignment precision.

In order to further prevent the micro epitaxial structures 120 from being dislocated during the substrate transfer process, the light emitting device 100a of the present embodiment may also further includes a first bonding layer 150a disposed between the micro epitaxial structures 120 and the second substrate 140a, and the second substrate 140a is fixed on the first substrate 110 through the first bonding layer 150a. As shown in FIG. 1A, the first bonding layer 150a is disposed on the second substrate 140a, and the first bonding layer 150a directly contacts the bonding pads 130a, which are disposed on the micro epitaxial structures 120, and is substantially a planar structure. In other words, a gap G between any two adjacent micro epitaxial structures 120 is substantially an air gap.

Figure 1B:
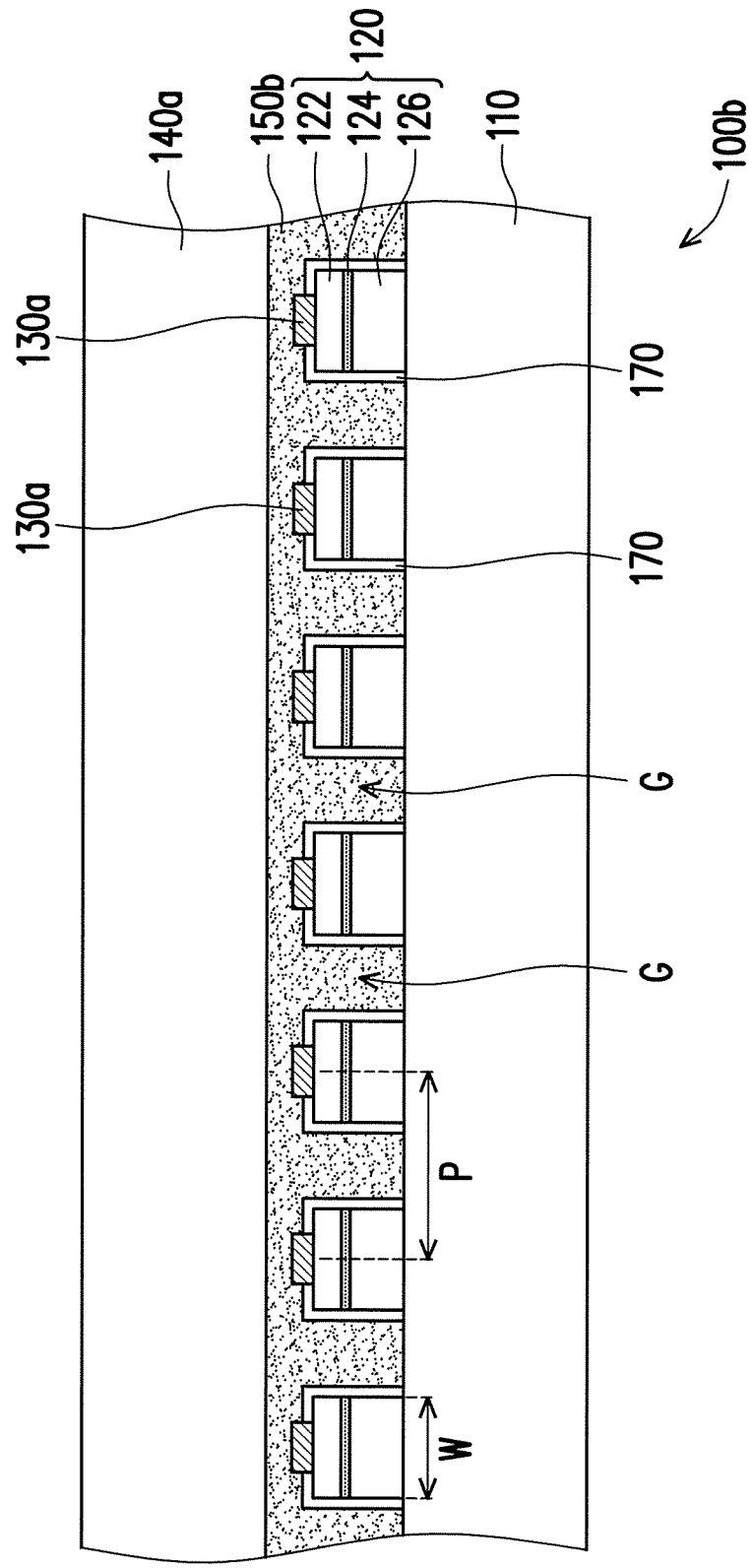
FIG. 1B is cross-sectional diagram illustrating a light emitting device according to another embodiment of the invention.

Certainly, the invention does not limit the structure and form of the first bonding layer 150a. In other embodiment, referring to FIG. 1B, a light emitting device 100b of the present embodiment is similar to the light emitting device 100a of FIG. 1A, whereby differences therebetween merely lie in that: a side of the micro epitaxial structures 120 of the light emitting device 100b of the present embodiment directly contacts the first substrate 110, the first bonding layer 150b encapsulates each of the micro epitaxial structures 120, and the first bonding layer 150b fills up the gaps G between the micro epitaxial structures 120. More specifically, since a bond force between the micro epitaxial structures 120 and the first substrate 110 (i.e., the growth substrate) is large, in order for the first substrate 110 to be effectively separated from the micro epitaxial structures 120 during the subsequent process and to fix the pitch between the micro epitaxial structures 120, the first bonding layer 150b must cover around and on the top surfaces of the micro epitaxial structures 120, such that the first bonding layer 150b on the top surfaces of the micro epitaxial structures 120 is used to bond with the second substrate 140a while the first bonding layer 150b used to fill the gaps G is used for fixing the pitch of the micro epitaxial structures 120, wherein the first substrate 110 is later removed during the subsequent process through laser lift-off (LLO).

Figure 1C:
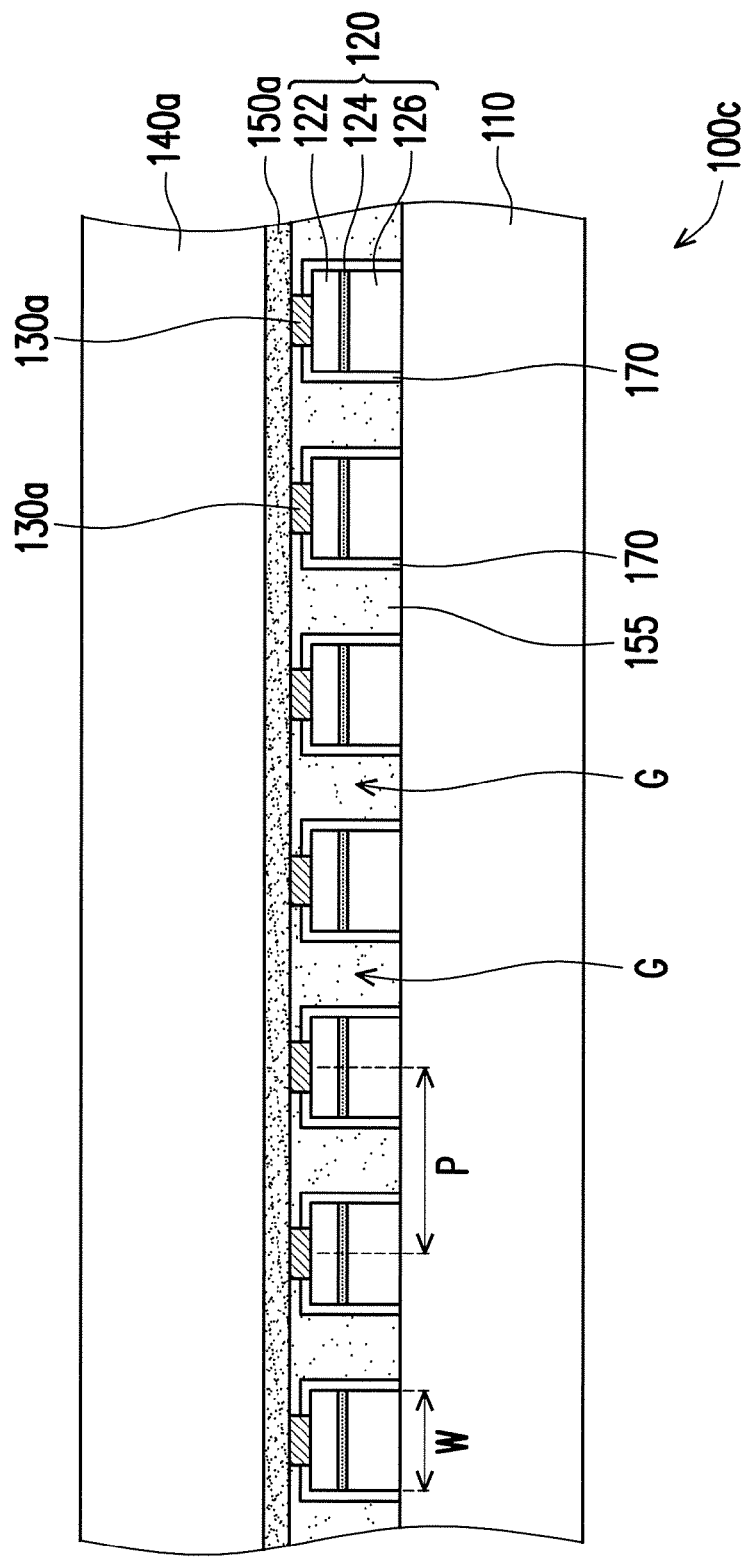
FIG. 1C is cross-sectional diagram illustrating a light emitting device according to another embodiment of the invention.

Furthermore, the gaps G of micro epitaxial structures 120 of the light emitting device 100b of the invention may also not be filled with the first bonding layer 150b. In other embodiment, referring to FIG. 1C, a light emitting device 100c of the present embodiment is similar to the light emitting device 100a of FIG. 1A, whereby differences therebetween merely lie in that: the light emitting device 100c of the present embodiment further includes an insulating material 155, which fills up the gaps G between the micro epitaxial structures 120 and directly contacts the first bonding layer 150a and the first substrate 110. Herein, since the purposes of the first bonding layer 150a and the insulating material 155 are different, material properties of the insulating material 155 may be different from that of the first bonding layer 150a. More specifically, the first bonding layer 150a is used for bonding the second substrate 140a, so that the second substrate 140a can be bonded with the micro epitaxial structures 120 through the first bonding layer 150a, while the insulating material 155 is used for fixing the pitch of the micro epitaxial structures 120. A viscosity of the insulating material 155 is less than a viscosity of the first bonding layer 150a, the insulating material 155 with low viscosity has better filling effect and can more accurately fix the pitch of the micro epitaxial structures 120; and the first bonding layer 150a with high viscosity has a greater bonding force with the micro epitaxial structures 120 and the second substrate 140a and can securely fix the micro epitaxial structures 120 on the second substrate 140a. In view of the above, by using the first bonding layer 150a and insulating material 155 in coordination, the micro epitaxial structures 120 can be transferred onto the second substrate 140a more accurately. On the other hand, the invention does not limit the structures and forms of the bonding pads 130a, the second substrate 140a and the first bonding layer 150a.

Figure 1D:
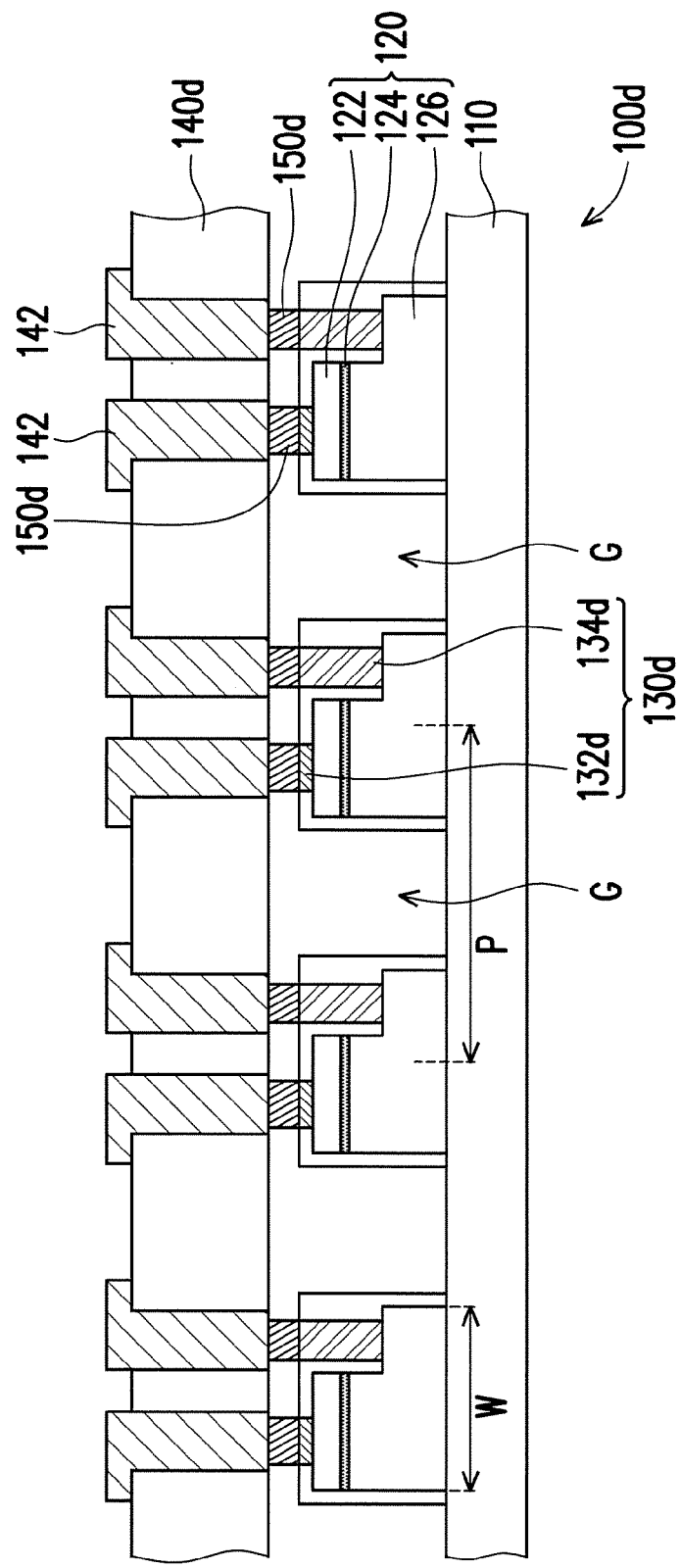
FIG. 1D is cross-sectional diagram illustrating a light emitting device according to another embodiment of the invention.

Referring to FIG. 1D, a light emitting device 100d of the present embodiment is similar to the light emitting device 100a of FIG. 1A, whereby a difference therebetween merely lies in that: bonding pads 130d of the light emitting device 100d of the present embodiment include a plurality of first bonding pads 132d and a plurality of second bonding pads 134d, and the surface of each of the micro epitaxial structures 120 that is relative distant to the first substrate 110 is disposed with one first bonding pad 132d and one second bonding pad 134d. The first bonding pads 132d and the first type semiconductor layers 122 of the micro epitaxial structures 120 are structurally and electrically connected, and the second bonding pads 134d and the second type semiconductor layers 126 of the micro epitaxial structures 120 are structurally and electrically connected. Herein, each of the micro epitaxial structures 120 and the bonding pad 130d thereon can define a horizontal light-emitting diode chip. Further, the second substrate 140d of the present embodiment is substantially a conductive substrate, and the second substrate 140d has a plurality of conductive vias structures 142. The first bonding pads 132d and the second bonding pads 134d structurally and electrically connect the conductive vias structures 142. Furthermore, the first bonding layer 150d of the present embodiment is substantially a patterned bonding layer, which is only located between the conductive vias structures 142 and the first bonding pads 132d and between the conductive vias structures and the second bonding pads 134d. The gap G between any two adjacent micro epitaxial structures 120 is substantially an air gap.

Figure 2A:
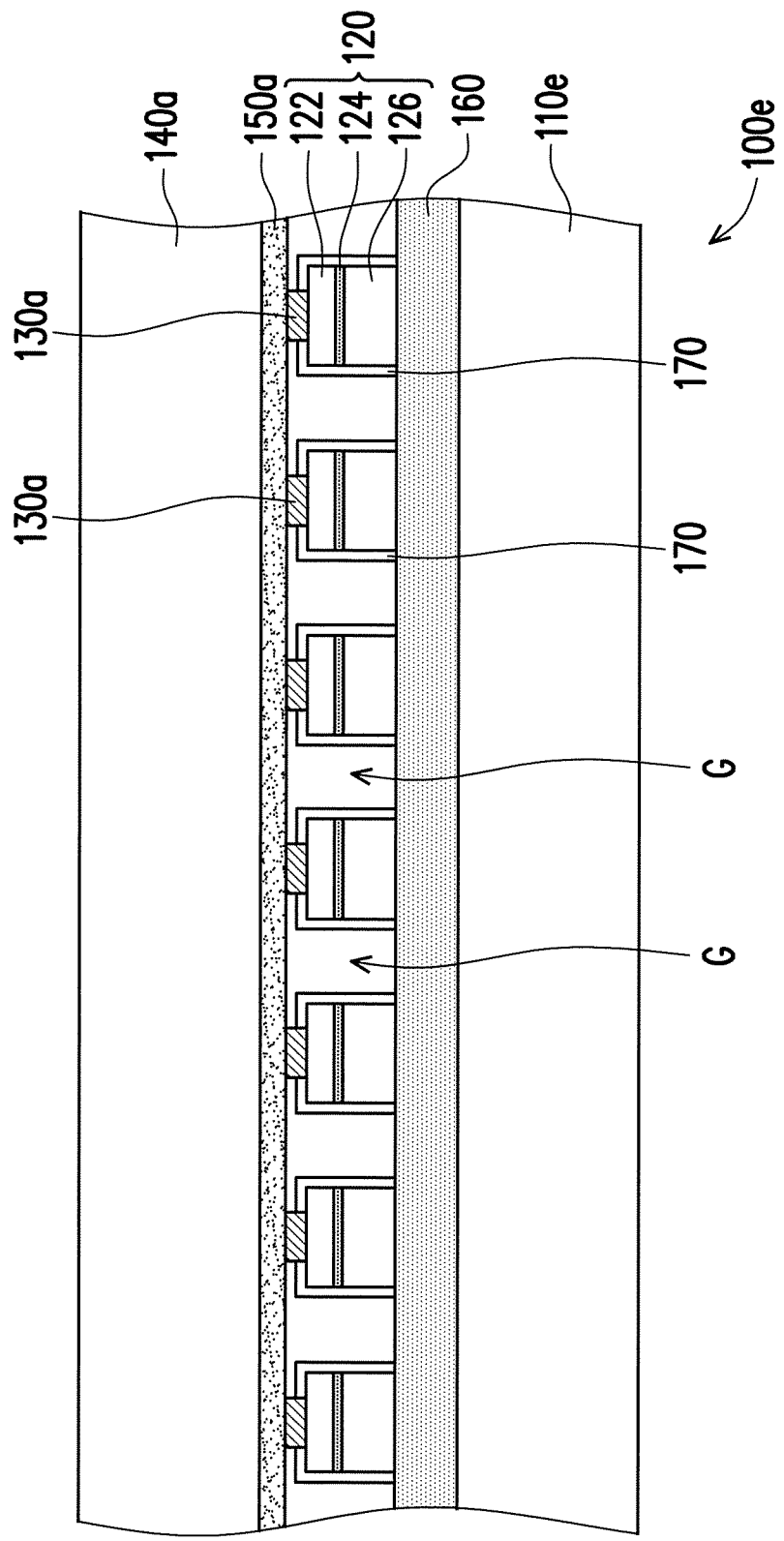
FIG. 2A is cross-sectional diagram illustrating a light emitting device according to another embodiment of the invention.

In addition, the invention does not limit the first substrate 110 to be only a growth substrate. Referring to FIG. 2A, a light emitting device 100e of the present embodiment is similar to the light emitting device 100a of FIG. 1A, wherein a differently merely lies in that: a first substrate 110e of the present embodiment is not a growth substrate but a temporary substrate, and thus the light emitting device 100e of the present embodiment may further includes a second bonding layer 160 located between the micro epitaxial structures 120 and the first substrate 110e, and the micro epitaxial structures 120 are fixed on the first substrate 110e through the second bonding layer 160. Herein, as shown in 2A, the micro epitaxial structures 120 directly contact the second bonding layer 160, and the gap G between any two adjacent micro epitaxial structures 120 is substantially an air gap.

Figure 2B:
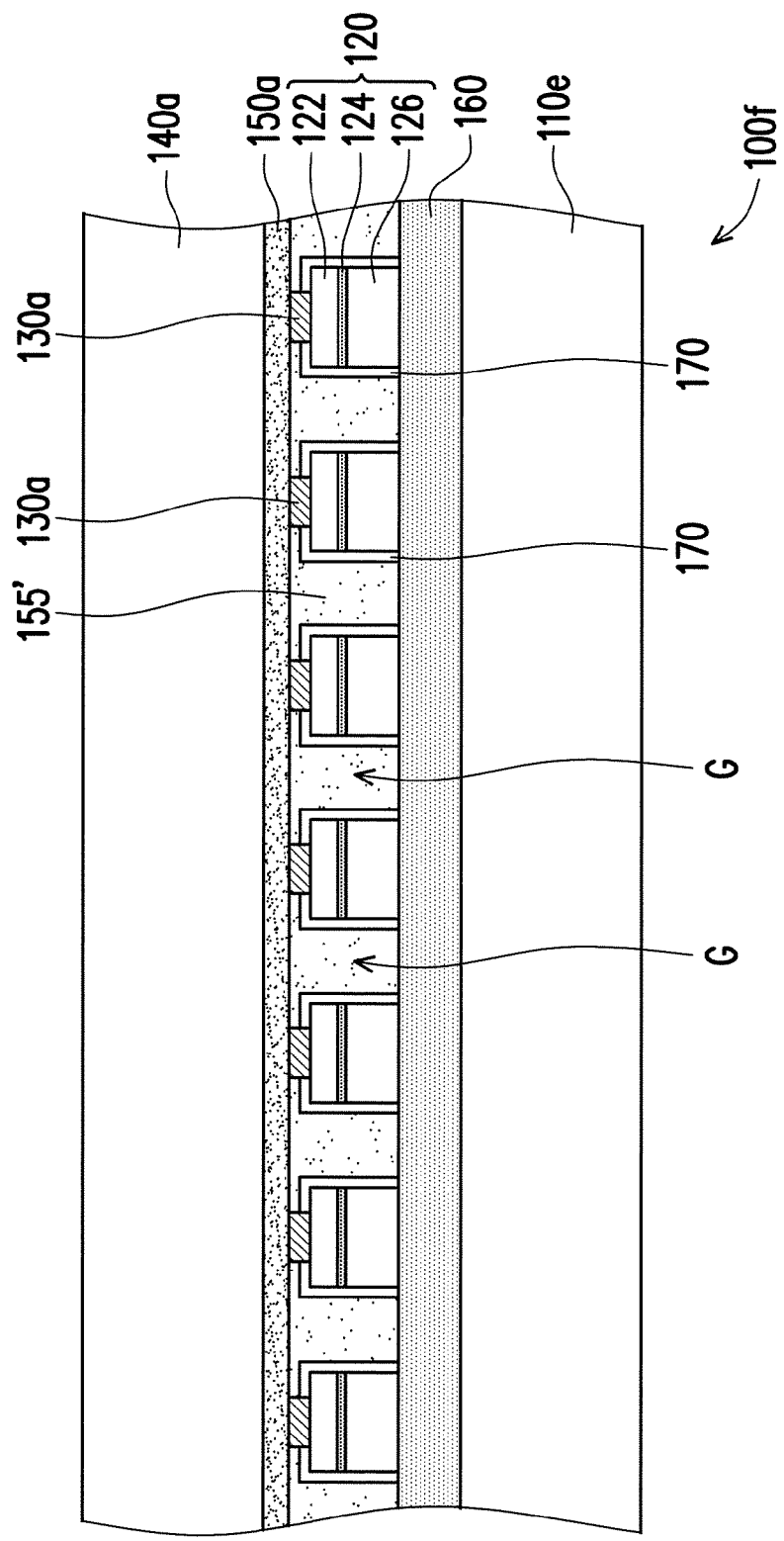
FIG. 2B is cross-sectional diagram illustrating a light emitting device according to another embodiment of the invention.

In another embodiment, referring to FIG. 2B, a light emitting device 100f of the present embodiment is similar to light emitting device 100e of FIG. 2A, whereby a difference therebetween merely lies in that: the light emitting device 100f of the present embodiment further includes an insulating material 155' disposed between the first substrate 110e and the second substrate 140a and filling up the gaps G between the micro epitaxial structures 120. Herein, the material of the insulating material 155' can be the same as or different from the material of the first bonding layer 150a and the material of the second bonding layer 160, wherein the invention is not limited thereto.

Figure 2C:
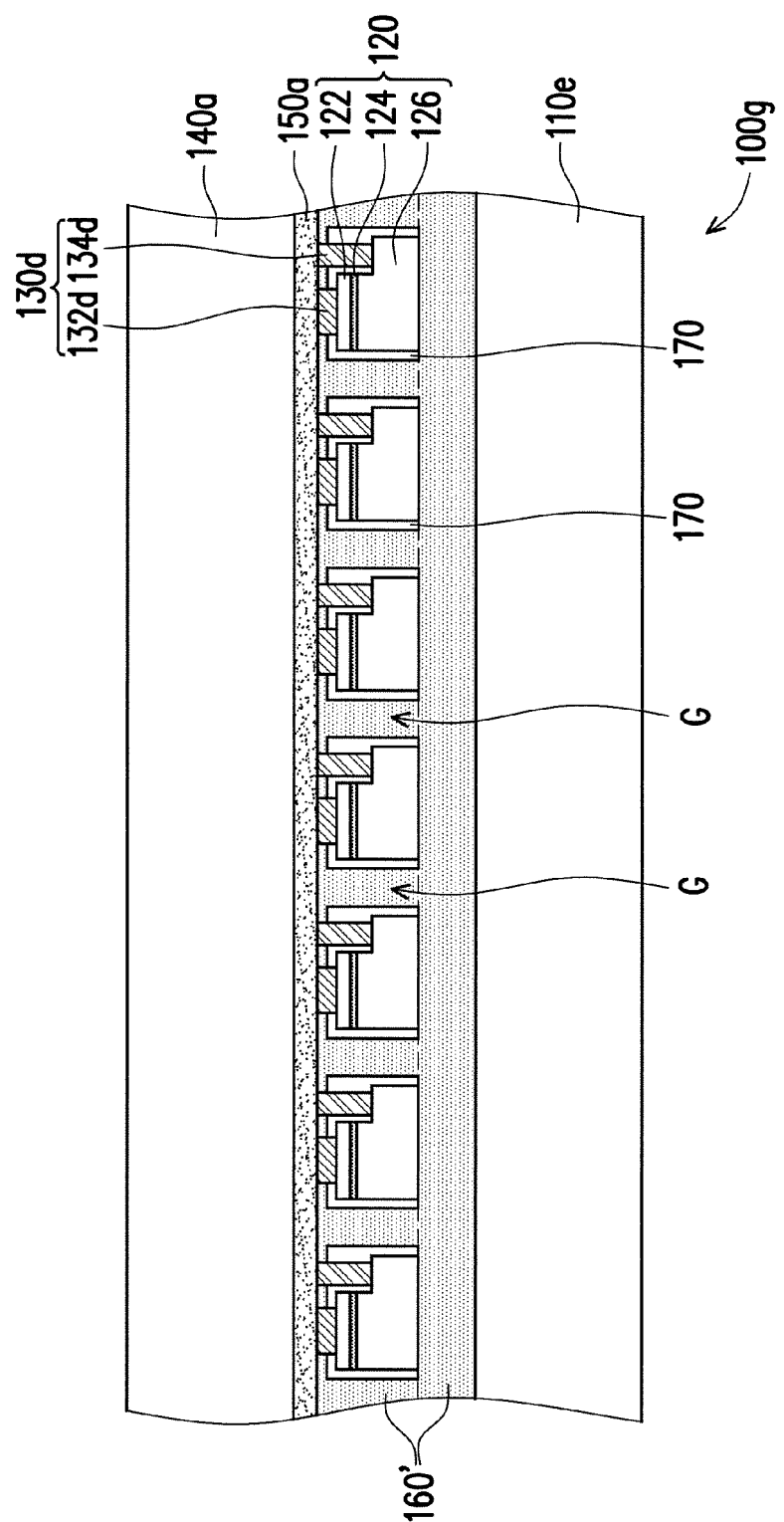
FIG. 2C is cross-sectional diagram illustrating a light emitting device according to another embodiment of the invention.

Also, in another embodiment, referring to FIG. 2C, a light emitting device 100g of the present embodiment is similar to the light emitting device 100e of FIG. 2A, whereby differences between the two merely lie in that: bonding pads 130d of the light emitting device 100g of the present embodiment include a plurality of first bonding pads 132d and a plurality of second bonding pads 134d, and the surface of each of the micro epitaxial structures 120 that is relatively distant to the first substrate 110e has one first bonding pad 132d and one second bonding pad 134d disposed thereon. The first bonding pads 132d and the first type semiconductor layers 122 of the micro epitaxial structures 120 are structurally and electrically connected, and the second bonding pads 134d and the second type semiconductor layers 126 of the micro epitaxial structures 120 are structurally and electrically connected. Herein, each of the micro epitaxial structures 120 and the bonding pad 130d thereon can define a horizontal light-emitting diode chip. In addition, the second bonding layer 160' of the present embodiment fills up the gaps G between the micro epitaxial structures 120 and directly contacts the first bonding layer 150a and the first substrate 110e.

In terms of processing, a manufacturing method of the light emitting device of the present embodiment can firstly be referred to FIG. 3A(a). A first substrate 110 is provided, wherein a coefficient of thermal expansion of the first substrate 110 is CTE1, the first substrate 110 has a plurality of micro epitaxial structures 120 periodically disposed thereon, a side length of each of the micro epitaxial structures 120 is W, W ranges from 1 to 100 micrometers, and a pitch between two adjacent micro epitaxial structures 120 is P, and W/P=0.1 to 0.95. In detail, the first substrate 110 is a sapphire substrate, and after an epitaxial film is grown on the first substrate 110 through metalorganic chemical vapor deposition, the epitaxial film is formed into the micro epitaxial structures 120 via a semiconductor processing method. Thus, the micro epitaxial structures 120 are directly formed on the first substrate 110. In other words, the first substrate 110 is a growth substrate of the micro epitaxial structures 120. Each of the micro epitaxial structures 120 includes a second type semiconductor layer 126, an active layer 124 and a first type semiconductor layer 122 sequentially stacked on the first substrate 110.

As shown in FIG. 3A(a), in the present embodiment, the micro epitaxial structures 120 further includes a plurality of bonding pads 130a disposed thereon, wherein the bonding pads 130a are respectively formed on the micro epitaxial structures 120 and located on the surfaces of the micro epitaxial structures 120 that are relatively distant to the first substrate 110. That is to say, the surface of each of the micro epitaxial structures 120 that is relatively distant to the first substrate 110 is disposed with one bonding pad 130a. Herein, each of the micro epitaxial structures 120 of the present embodiment and each of the bonding pads 130a can define a vertical light-emitting diode chip. In order to effectively protect the micro epitaxial structures 120, the manufacturing method of the light emitting device of the present embodiment further includes to form a plurality of insulating layers 170, wherein the insulating layers 170 respectively encapsulate the sides of the micro epitaxial structures 120, and the insulating layers 170 expose the bonding pads 130a, so as to effectively effect the edges of the micro epitaxial structures 120, thereby preventing the water vapor and oxygen invasions and effectively enhancing the product reliability. Herein, the material of the insulating layers 170 may, for example, be alumina, silicon dioxide, silicon nitride or a combination thereof.

The invention does not limit the structure and form of the bonding pads 130a. In other embodiment, as shown in FIG. 3A(b), bonding pads 130d of the present embodiment include a plurality of first bonding pads 132d and a plurality of second bonding pads 134d, and the surface of each of the micro epitaxial structures 120 that is relatively distant to the first substrate 110 is disposed with one first bonding pad 132d and one second bonding pad 134d thereon. The first bonding pads 132d and the first type semiconductor layer 122 of the micro epitaxial structures 120 are structurally and electrically connected, and the second bonding pads 134d and the second type semiconductor layers 126 of the micro epitaxial structures 120 are structurally and electrically connected. Herein, each of the micro epitaxial structures 120 and the bonding pad 130d thereon can define a lateral light-emitting diode chip. The insulating layers 170 respectively encapsulate the sides of the micro epitaxial structures 120, and the insulating layers 170 expose the bonding pads 130d, so as to effectively protect the edges of the micro epitaxial structures 120, thereby preventing the water vapor and oxygen invasions and effectively enhancing the product reliability.

The invention does not limit that the first substrate 110 to be only a growth substrate. In another embodiment, as shown in FIG. 3A(c), a first substrate 110e is a temporary substrate, and thus the micro epitaxial structures 120 may be fixed on the first substrate 110e through an adhesive layer (i.e., the second bonding layer 160).

Next, referring to FIG. 3B(a), the bonding material (i.e., the first bonding layer 150a) is provided on the first substrate 110. Herein, the first bonding layer 150a covers on the micro epitaxial structures 120 via a film coating method, directly contacts the bonding pads 130a disposed on the micro epitaxial structures 120, and is substantially a planar structure. In other words, the gap G between any two adjacent micro epitaxial structures 120 is substantially the air gap.

In another embodiment, referring to FIG. 3B(b), the bonding material (i.e., the first bonding layer 150b) is covered on the micro epitaxial structures 120 via the spin coating method through performing one time of spin coating, wherein the first bonding layer 150b fills up the gaps G between the micro epitaxial structures 120, so as to prevent the epitaxial structures 120 from being dislocated during the subsequent substrate transfer process.

In another embodiment, referring to FIG. 3B(c), the bonding material (i.e., the first bonding layer 150a and the insulating material 155) is also formed on the first substrate 110 via the spin coating method through performing multiple times of spin coating. Herein, the insulating material 155 fills up the gaps G between the micro epitaxial structures 120 and directly contacts the first bonding layer 150a and the first substrate 110, so as to prevent the epitaxial structures 120 from being dislocated during the subsequent substrate transfer process. Herein, the material of the insulating material 155 can be different from that of the first bonding layer 150a.

Certainly, the invention does not limit the structure and form of the bonding material. In another embodiment, referring to FIG. 3B(d), the bonding material (i.e., the first bonding layer 150d) may also be a patterned bonding layer disposed on the first bonding pads 132d and the second bonding pads 134*d* of the bonding pads 130*d*. Herein, the bonding material with a planar structure is firstly formed to cover on the micro epitaxial structures 120 via a film coating method, and is then formed into the patterned bonding layer through an etching process.

In another embodiment, referring to FIG. 3B(e), when the first substrate 110*e* is not a growth substrate, the micro epitaxial structures 120 are fixed on the first substrate 110*e* through an adhesive layer (i.e., the second bonding layer 160') and the adhesive layer (i.e., the second bonding layer 160') fills up the gaps G between the micro epitaxial structures 120. Herein, the adhesive layer (i.e., the second bonding layer 160') and the bonding material (i.e., the first bonding layer 150*a*) may be formed on the first substrate 110 by performing multiple times of spin coating. The bonding material (i.e., the first bonding layer 150*a*) is disposed on the adhesive layer (i.e., the second bonding layer 160') and directly contacts the first bonding pads 132*d*, the second bonding pads 134*d* and the adhesive layer (i.e., the second bonding layer 160').

Figure 3C:
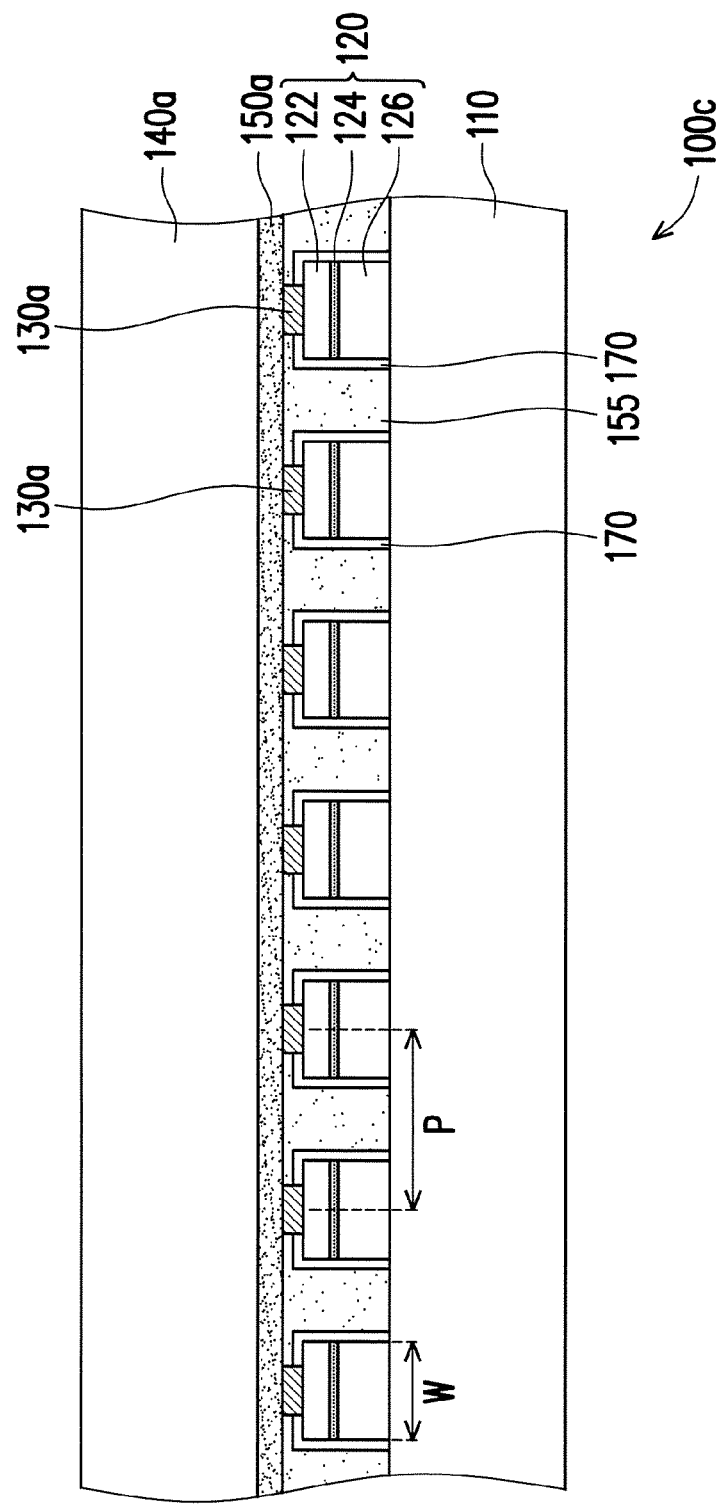
FIG. 3A(a) to FIG. 3D(c) are cross-sectional diagrams respectively illustrating manufacturing methods of light emitting devices according to several embodiment of the invention.
Figure 3C:
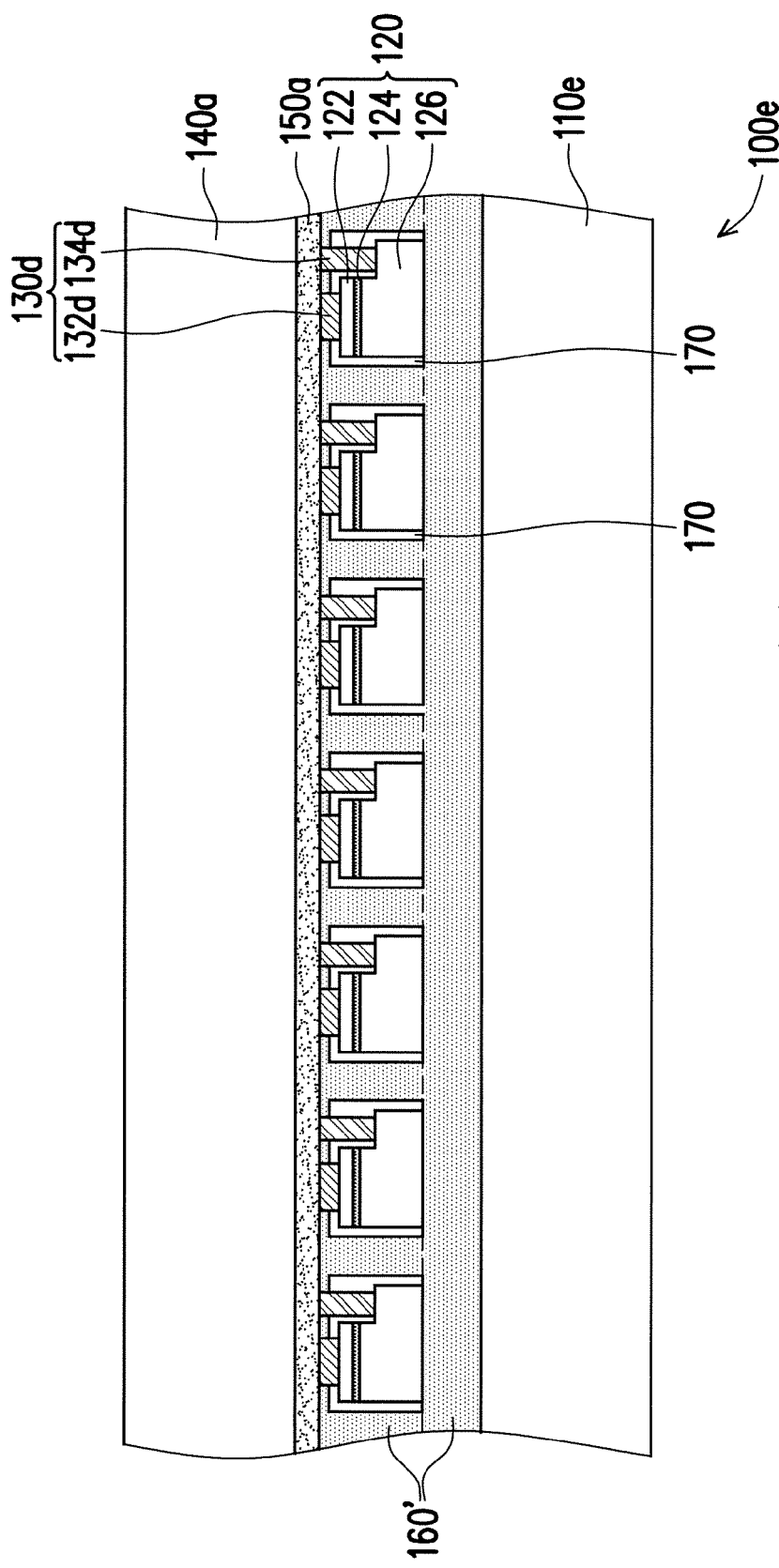
Figure 3C:
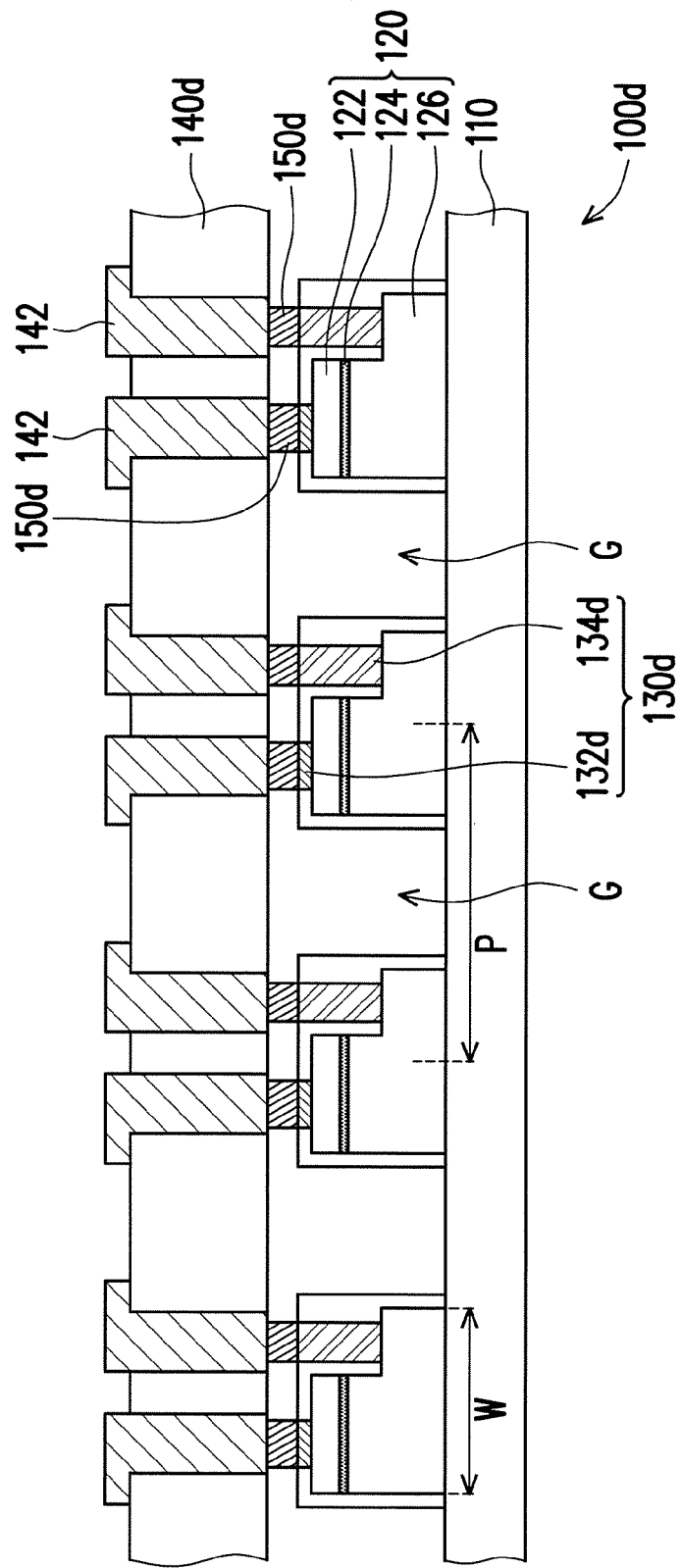

Next, referring to FIG. 3C(a) and FIG. 3C(b), the second substrate 140*a* is disposed opposite to the first substrate 110, 110*e*, the micro epitaxial structures 120 are located between the first substrate 110, 110*e* and the second substrate 140*a*, and the second substrate 140*a* is bonded with the micro epitaxial structures 120 through the bonding material (i.e., the first bonding layer 150*a*), wherein the coefficient of thermal expansion of the second substrate 140*a* is CTE2, and CTE2/CTE1=0.8 to 1.2. Preferably, when W/P ranges from 0.1 to 0.6, CTE2/CTE1=0.9 to 1.1. Herein, the sizes and the shapes of the first substrate 110, 110*e* and the second substrate 140*a* are not particularly limited, and the manufacturing of the light emitting device 100*c*, 100*e* is completed. In addition, in other embodiment, the first substrate 110, 110*e* and the second substrate 140*a* may have approximately the same size and the same shape (please refer to the structures and forms of the first substrate 110' and the second substrate 140*a*' in FIG. 1A'), so that the first substrate 110, 110*e* and the second substrate 140*a* can have the similar boundary conditions, thereby effectively increasing the transfer yield of the micro epitaxial structures 120 at the edges.

In another embodiment, referring to FIG. 3C(c), the second substrate 140*d* of the present embodiment may also be a conductive substrate, the second substrate 140*d* may have a plurality of conductive vias structures 142, and the first bonding pads 132*d* and the second bonding pads 134*d* are structurally and electrically connected with the conductive vias structures 142. Furthermore, the bonding material (i.e., the first bonding layer 150*d*) of the present embodiment is only located between the conductive vias structures 142 and the first bonding pads 132*d* and between the conductive vias structures 142 and the second bonding pads 134*d*, and the micro epitaxial structures 120 are connected with the second substrate 140*d* through the bonding material (i.e., the first bonding layer 150*d*). At this moment, the manufacturing of the light emitting device 100*d* is completed.

Figure 3D:
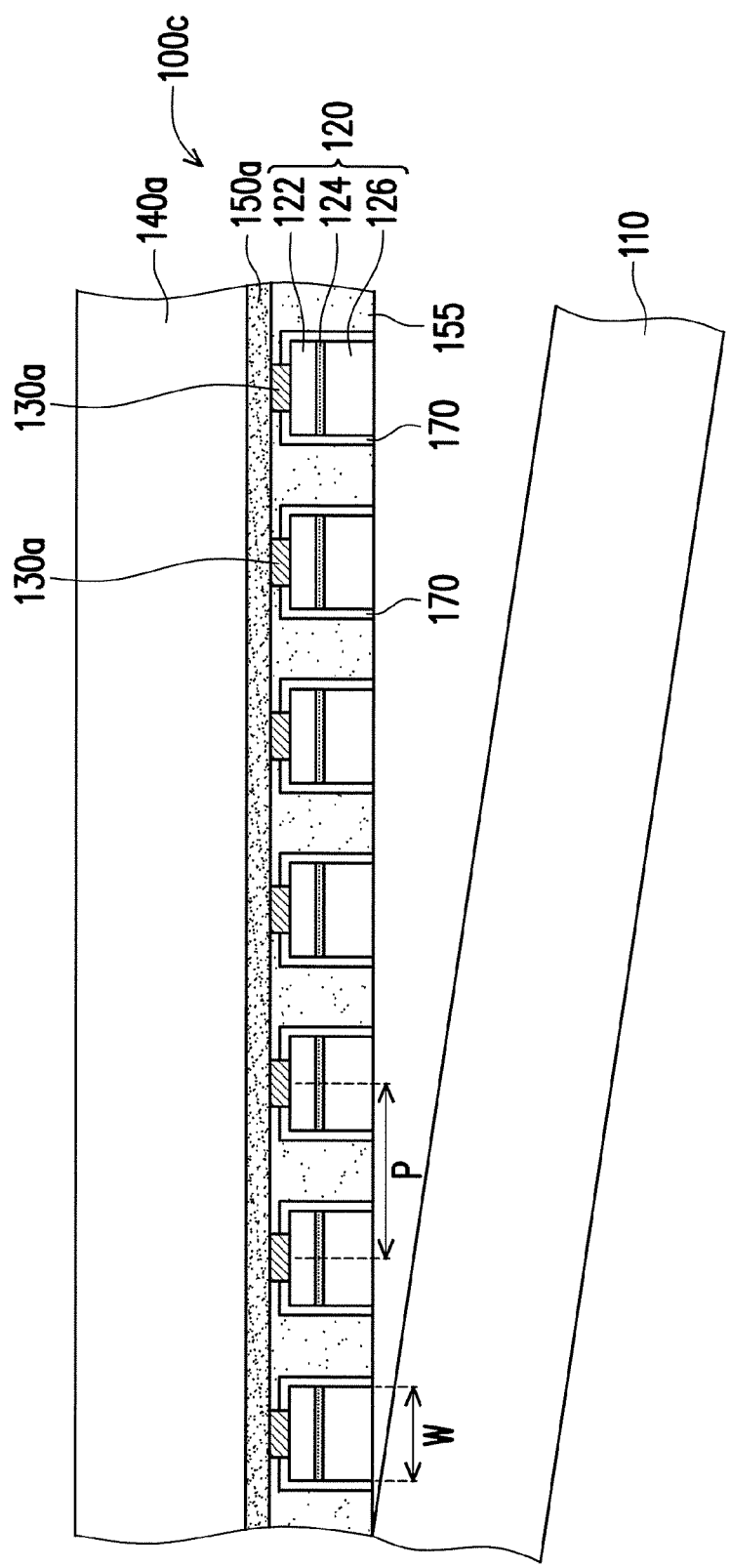
Figure 3D:
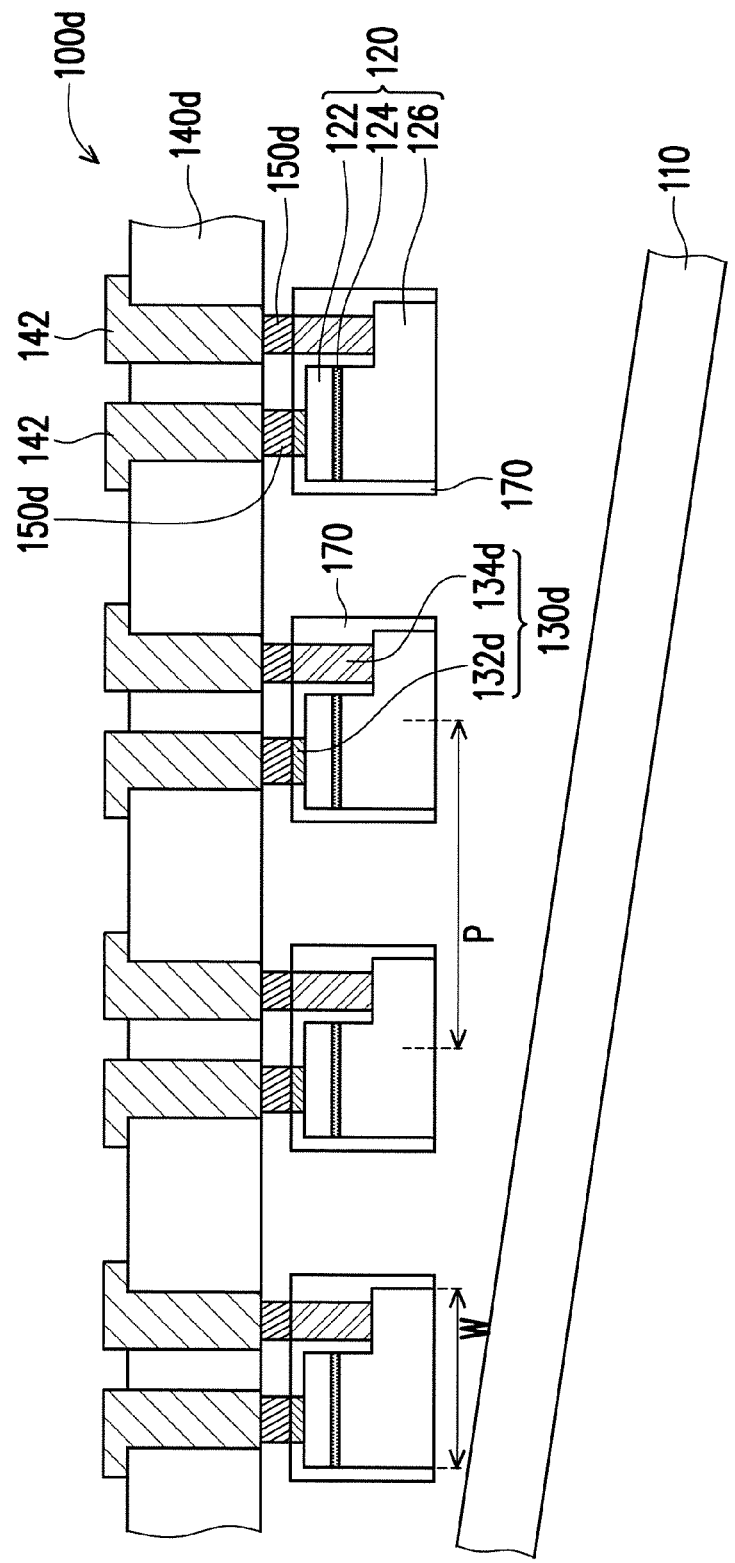
Figure 3D:
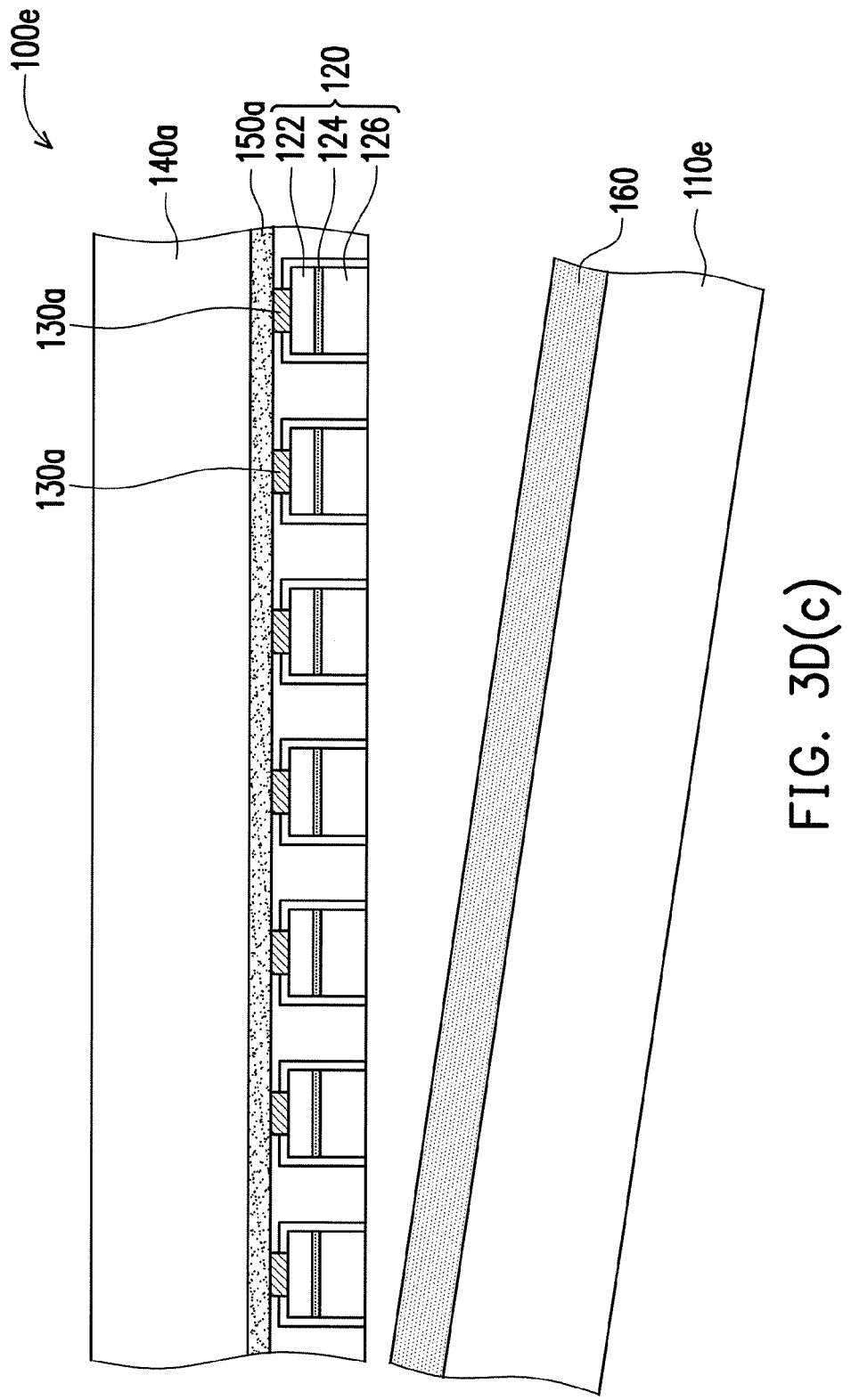

Finally, referring to FIG. 3D(a) and FIG. 3D(b), when the first substrate 110 is a sapphire substrate, the first substrate 110 may be separated from the micro epitaxial structures 120 by means of laser lift-off (LLO). Otherwise, referring to FIG. 3D(c), when the first substrate 110*e* is not a growth substrate of the micro epitaxial structures 120 but a temporary substrate, the first substrate 110*e* and the bonding material (i.e., the second bonding layer 160) can also be directly removed by means of LLO or liquid exfoliation.

Since the coefficient of thermal expansion (i.e. CTE1) of the first substrate 110, 110*e* and the coefficient of thermal expansion (i.e. CTE2) of the second substrate 140*a*, 140*d* of the light emitting device 100*c*, 100*d*, 100*e* of the present embodiment are related to the side length (i.e. W) and the pitch (i.e. P) of the micro epitaxial structures 120, when W/P=0.1 to 0.95, CTE2/CTE1=0.8 to 1.2. That is, the light emitting device 100*c*, 100*d*, 100*e* of the present embodiment adopts the first substrate 110, 110*e* and the second substrate 140*a*, 140*d* which have similar coefficients of thermal expansion, and thus in the substrate transfer process, such as when transferring the micro epitaxial structures 120 from the first substrate 110, 110*e* onto the second substrate 140*a*, 140*d*, the micro epitaxial structures 120 will not produce a displacement due to a variation between the coefficients of thermal expansion of the first substrate 110, 110*e* and the second substrate 140*a*, 140*d*. As a result, the micro epitaxial structures 120 can be transferred between the first substrate 110, 110*e* and the second substrate 140*a*, 140*d* with a fixed pitch, and thus can have a preferable alignment precision.

In summary, since the coefficient of thermal expansion (i.e., CTE1) of the first substrate and the coefficient of thermal expansion (i.e., CTE2) of the second substrate of the light emitting device of the invention are related to the side length (i.e., W) and the pitch (i.e., P) of the micro epitaxial structures, when W ranges from 1 to 100 micrometers and W/P=0.1 to 0.95, CTE2/CTE1=0.8 to 1.2. That is, the light emitting device of the invention adopts the first substrate and the second substrate which have similar coefficients of thermal expansion. Therefore, in the substrate transfer process, when the micro epitaxial structures are about to be transferred from the first substrate onto the second substrate, the micro epitaxial structures will not produce a displacement due to a variation between the coefficients of thermal expansion of the first substrate and the second substrate. As a result, the micro epitaxial structures can be transferred between the first substrate and the second substrate with a fixed pitch, and thereby can have the preferable alignment precision.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a light emitting device, comprising:
   providing a first substrate, a coefficient of thermal expansion of the first substrate being CTE1, and the first substrate having a plurality of micro epitaxial structures disposed thereon, wherein the micro epitaxial structures are connected to the first substrate through an adhesive layer, wherein a side length of each of the micro epitaxial structures is W, W ranges from 1 to 100 micrometers, a pitch of any two adjacent micro epitaxial structures is P, and W/P=0.1 to 0.95;
   providing an adhesive material on the first substrate;
   disposing a second substrate opposite to the first substrate, wherein the micro epitaxial structures is located between the first substrate and the second substrate, and the adhesive material covers the micro epitaxial structures via a film coating method and then bonded with the second substrate via a thermocompression bonding method, and the adhesive material contacts a plurality of side-walls of the micro epitaxial structures, wherein a coefficient of thermal expansion of the second substrate is CTE2, and CTE2/CTE1=0.8 to 1.2; and separating the first substrate from the micro epitaxial structures.

2. The manufacturing method of the light emitting device as recited in claim 1, wherein each of the micro epitaxial structures comprises a first type semiconductor layer, a second type semiconductor layer and an active layer located between the first type semiconductor layer and the second type semiconductor layer, and the adhesive layer directly contacts the second type semiconductor layer.

3. The manufacturing method of the light emitting device as recited in claim 1, wherein each of the micro epitaxial structures defines a vertical light-emitting diode chip.

4. The manufacturing method of the light emitting device as recited in claim 2, wherein each of the micro epitaxial structures defines a horizontal light-emitting diode chip and has two bonding pad disposed between the first type semiconductor layer and the first substrate.

\* \* \* \* \*